(12) United States Patent
Sundaram et al.

(10) Patent No.: US 9,721,948 B1
(45) Date of Patent: Aug. 1, 2017

(54) SWITCH IMPROVEMENT USING LAYOUT OPTIMIZATION

(71) Applicant: GLOBALFOUNDRIES INC., Grand Cayman (KY)

(72) Inventors: Ananth Sundaram, Nagawara Bengaluru (IN); Balaji Swaminathan, Nagawara Bengaluru (IN); Srikumar Konduru, Nagawara Bengaluru (IN); Alvin Joseph, Williston, VT (US); Michael Zierak, Essex Junction, VT (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/013,411

(22) Filed: Feb. 2, 2016

(51) Int. Cl.
  *H01L 27/088* (2006.01)
  *H01L 23/528* (2006.01)
  *H01L 21/8234* (2006.01)

(52) U.S. Cl.
  CPC .... *H01L 27/088* (2013.01); *H01L 21/823418* (2013.01); *H01L 21/823475* (2013.01); *H01L 23/528* (2013.01)

(58) Field of Classification Search
  CPC .................................................. H01L 23/528
  See application file for complete search history.

(56) References Cited

U.S. PATENT DOCUMENTS

| | | | | |
|---|---|---|---|---|
| 2006/0170046 A1* | 8/2006 | Hara | ...................... | H01L 21/84 257/347 |
| 2009/0059640 A1* | 3/2009 | Funane | .................... | G11C 8/16 365/51 |
| 2010/0219514 A1* | 9/2010 | Ohguro | ................. | H01L 23/552 257/659 |
| 2016/0027499 A1* | 1/2016 | Liaw | ..................... | G11C 11/412 365/154 |
| 2016/0211212 A1* | 7/2016 | Chao | ................... | H01L 23/5226 |

OTHER PUBLICATIONS

Yazawa,Kazuaki; Ultrafast Submicron Thermoreflectance Imaging; Mar. 1, 2011.*

* cited by examiner

*Primary Examiner* — Trung Q Dang
*Assistant Examiner* — Wasiul Haider
(74) *Attorney, Agent, or Firm* — Thompson Hine LLP; Anthony Canale (57) ABSTRACT

Chip structures having wiring coupled with the device structures of a high frequency switch and methods for fabricating such chip structures. A transistor is formed that includes a first source/drain region, a second source/drain region, and a first gate electrode having a first width aligned in a first direction. A wiring level is formed that includes a wire coupled with the first source/drain region. The wire has a length aligned in a second direction that is different from the first direction.

16 Claims, 8 Drawing Sheets

SWITCH IMPROVEMENT USING LAYOUT OPTIMIZATION

BACKGROUND

The invention relates generally to semiconductor devices and integrated circuit fabrication and, in particular, to chip structures having wiring coupled with the device structures of a high frequency switch and methods for fabricating such chip structures.

Mobile communication devices (e.g., laptops, cellular phones, tablets, etc.) may utilize BiCMOS circuitry to handle wireless high frequency signals transmitted to the mobile communication devices and received by the mobile communication devices. The BiCMOS circuitry may include one or more switches used to selectively route high frequency signals, which are typically in the radiofrequency (RF) band, received by an antenna from a low noise amplifier to other chip circuitry and to selectively route high frequency signals from a power amplifier to the antenna. These high frequency switches may include a stack or bank of field effect transistors that are formed by complementary metal-oxide semiconductor (CMOS) processes. Switches may be characterized by various figures of merit (FOM), such as the on-resistance (Ron), the off-capacitance (Coff), and their multiplicative product.

A back-end-of-line (BEOL) interconnect structure may be used to route these high frequency signals to and from the active devices of the switch. The BEOL interconnect structure may include wiring embedded in a stack of dielectric layers to create a stack of metallization levels defining an interconnection network for the signals. The BEOL interconnect structure may be fabricated using damascene processes in which the different metallization levels in the stack are individually formed.

Chip structures having wiring coupled with a high frequency switch and methods for fabricating such chip structures are needed in order to improve one or more FOMs.

SUMMARY

In embodiments of the invention, chip structures and methods for fabricating a chip structure are provided. A transistor is formed that includes a first source/drain region, a second source/drain region, and a first gate electrode having a first width aligned in a first direction. A wiring level is formed that includes a wire coupled with the first source/drain region. The wire has a length aligned in a second direction that is different from the first direction.

In an embodiment of the invention, a wiring structure includes a first wiring level and a second wiring level including a second wire coupled with the first wire. The second wire has a length aligned in a direction that is different from a direction in which a length of the first wire is aligned.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
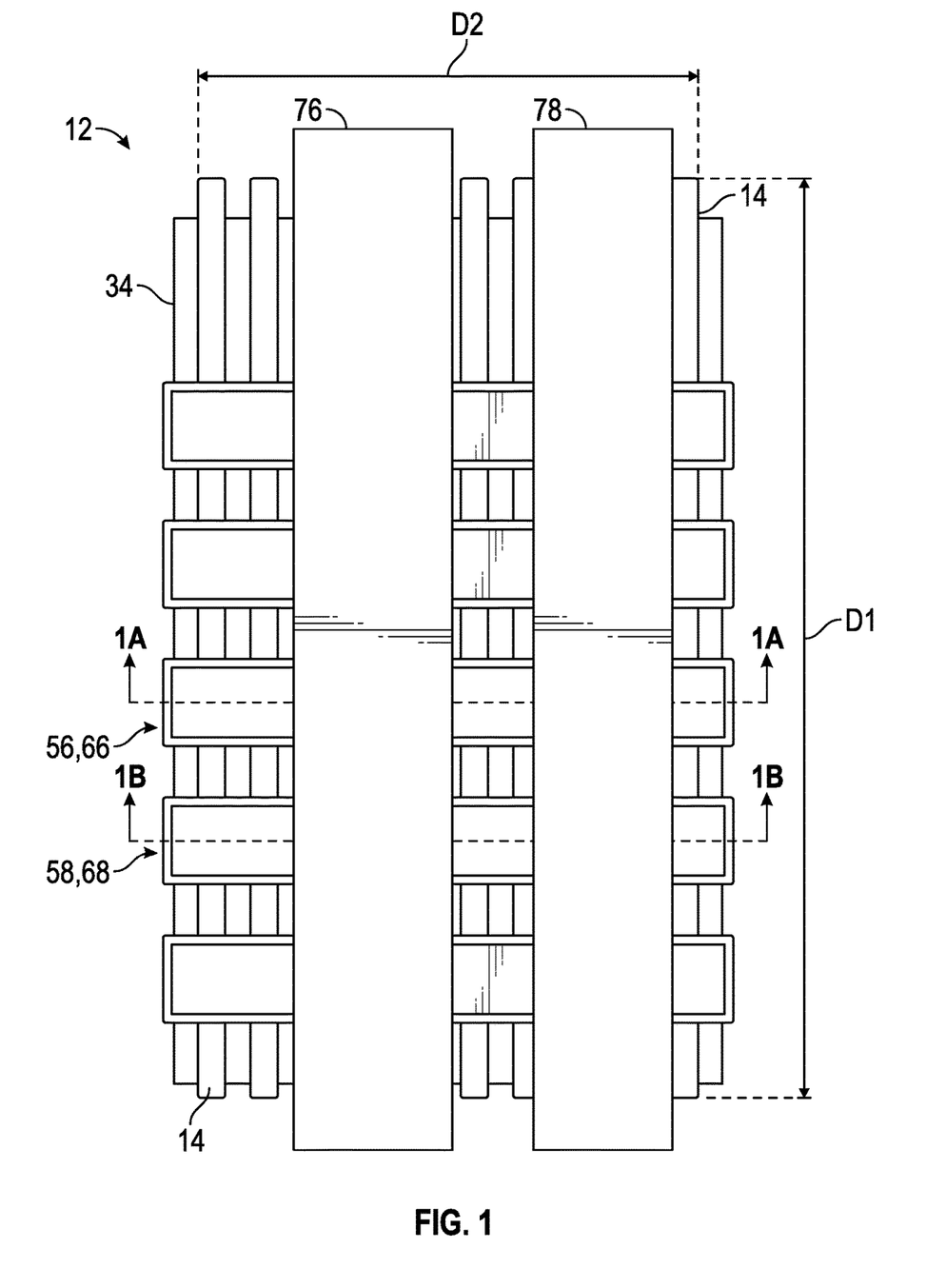
FIG. 1 is a top view of a chip structure in accordance with an embodiment of the invention and in which the dielectric layers of the interconnect structure are omitted for clarity of description.
Figure 1A:
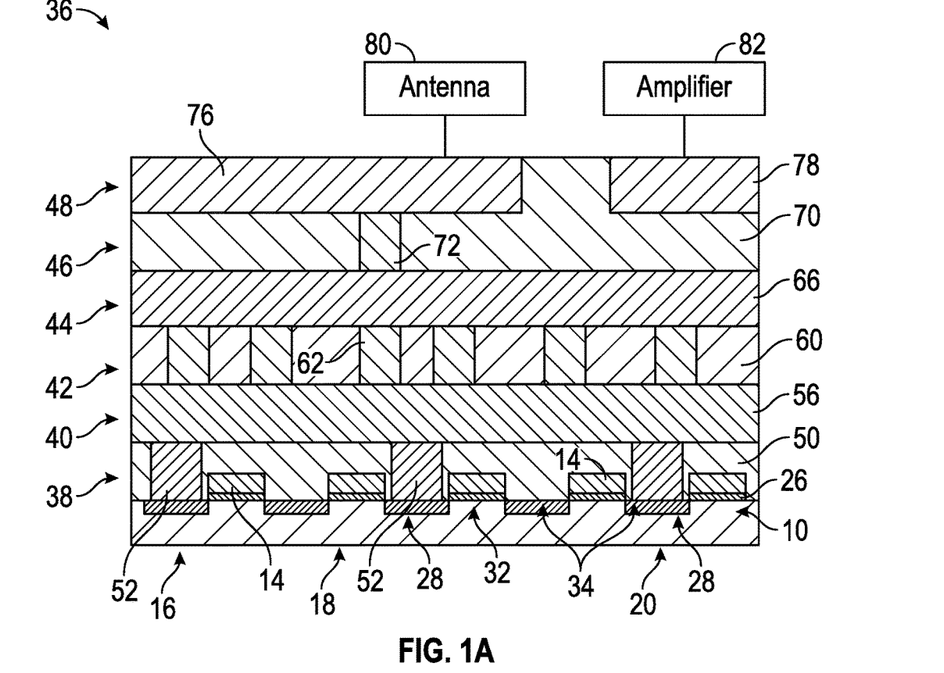
FIG. 1A is a cross-sectional view taken generally along line 1A-1A in FIG. 1.
Figure 1B:
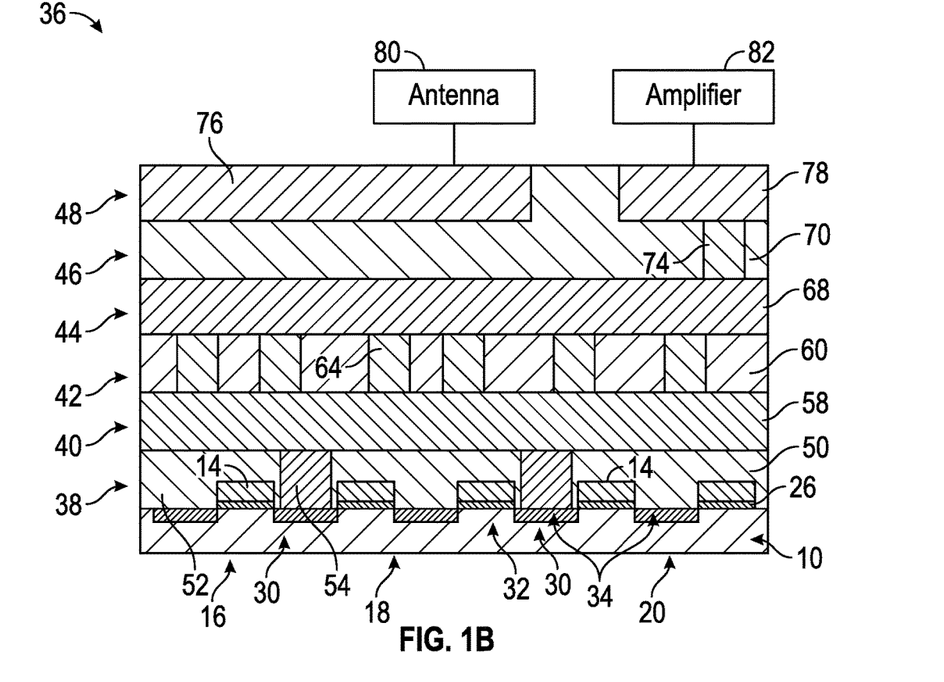
FIG. 1B is a cross-sectional view taken generally along line 1B-1B in FIG. 1.

With reference to FIGS. 1, 1A, 1B and in accordance with an embodiment of the invention, a substrate 10 comprises a single-crystal semiconductor material usable to form the devices of an integrated circuit. The substrate 10 may be a bulk wafer, a bulk wafer that includes an epitaxial layer at its top surface, or the device layer of a silicon-on-insulator wafer. A switch 12 is formed by front-end-of-line (FEOL) processing using the substrate 10 as part of the integrated circuitry of a chip. The switch 12 includes a plurality of gate electrodes 14 that are arranged as parallel fingers and that participate in forming device structures, such as the representative device structures generally indicated by reference numerals 16, 18, 20.

In one embodiment, the device structures 16, 18, 20 may be a bank or stack of field effect transistors that are wired together in series, and that are arranged in direction D1 along the width of the gate electrode 14 that is shared by the device structures 16, 18, 20. In addition to being associated with one of the gate electrodes 14, each of the device structures 16, 18, 20 includes other components, such as heavily-doped source/drain diffusions or regions 28, 30 formed in the semiconductor material of the substrate 10 flanking and adjacent to the gate electrode 14. In an embodiment, source/drain regions 28 may act as drains and source/drain regions 30 may act as sources, or the converse assignments may apply.

The gate electrodes 14 are components of a gate stack that also includes a gate dielectric layer 26 positioned between the gate electrode 14 and a top surface of the substrate 10. The gate electrodes 14 have a thickness or height relative to the plane of the substrate 10, as well as lengths and widths in a plane normal to the height. The widths (i.e., the long axis) of the gate electrodes 14 are aligned in a direction D1, and the lengths (i.e., the short axis) of the gate electrodes 14 are aligned in direction D2. The gate length represents the distance from source/drain region 28 to source/drain region 30. The source/drain regions 28 of the different device structures 16, 18, 20 on one side of their shared gate electrode 14 are aligned in direction D1 parallel to the width of the shared gate electrode 14. The source/drain regions 30 of the different device structures 16, 18, 20 on the opposite side of their shared gate electrode 14 are also aligned in direction D1 parallel to the width of the shared gate electrode 14.

A channel region 32 is defined in the semiconductor material of the substrate 10 at a location located beneath each gate electrode 14. The channel region 32 is located between the source/drain regions 28 and the source/drain regions 30 associated the particular gate electrode 14. The semiconductor material of the substrate 10 that constitutes the source/drain regions 28, 30 may be doped to have a conductivity type opposite to the conductivity type of the semiconductor material constituting the channel region 32.

The gate electrodes 14 and gate dielectric layers 26 may be formed by depositing a layer stack and patterning the layer stack with photolithography and etching to provide the parallel fingers of gate electrodes 14. The gate electrodes 14 are composed of a conductor, such as a metal, doped polysilicon, a metal silicide, or a layered combination of these and other conductive materials. The gate dielectric layers 26 are composed of a dielectric or insulating material including, such as silicon dioxide ($SiO_2$), a high-k dielectric such as hafnium oxide ($HfO_2$), or a layered combination of these and other dielectric materials. The source/drain regions 28, 30 may be formed in a self-aligned manner by implantation or diffusion of a suitable dopant, such as a Group V dopant like arsenic (As) or phosphorous (P) for n-type conductivity or a Group III dopant like boron (B) for p-type conductivity, into the semiconductor material of the substrate 10.

The device structures 16, 18, 20 may include other components such as halo regions, lightly doped drain (LDD) extensions, etc. Non-conductive spacers (not shown) may be formed on the vertical sidewalls of the gate electrodes 14. Shallow trench isolation regions (not shown) supplying electrical isolation for the device structures 16, 18, 20 may be formed in the substrate 10.

The gate electrodes 14 and source/drain regions 28, 30 are coupled with metal features contained in an interconnect structure, generally indicated by reference numeral 36, which is fabricated by middle-of-line (MOL) and back-end-of-line (BEOL) processing. During middle-of-line processing, a silicide layer 34 is formed on the top surfaces of the source/drain regions 28, 30, and is separated from the gate electrodes 14 by the non-conductive spacers on the gate electrode sidewalls. The interconnect structure 36 includes multi-level metallization distributed in a contact level 38, a plurality of via levels 42, 46, and a plurality of wiring levels 40, 44, 48.

The contact level 38 and the wiring level 40 are formed in one or more dielectric layers 50. Contact level 38 includes multiple contacts 52 extending through the one or more dielectric layers 50 to the silicide layer 34 on the source/drain regions 28 and multiple contacts 54 extending through the one or more dielectric layers 50 to the silicide layer 34 on the source/drain regions 30. Wiring level 40 includes wires 56 coupled by the contacts 52 with the source/drain regions 28 and wires 58 coupled by the contacts 54 with the source/drain regions 30. The wires 56, 58 have a thickness or height relative to the plane of the substrate 10, as well as lengths and widths in a plane normal to the height. The lengths of the wires 56, 58 are significantly larger in dimension units than their respective widths, and are aligned in the direction D2. Wires 56, 58 alternate with each other in direction D1 and have a spaced relationship in direction D1 with a given spacing selected in order to permit the wires 56 to contact the source/drain regions 28 and the wires 58 to contact the source/drain regions 30. For example, the alternating pattern and spacing permits one of wires 56 to be coupled by contacts 52 with the respective source/drain regions 28 of device structures 16, 18, 20 (FIG. 1A) and one of wires 58 to be coupled by contacts 54 with the respective source/drain regions 30 of device structures 16, 18, 20 (FIG. 1B).

The wires 56, 58 in wiring level 40 are aligned in direction D2 parallel relative to each other, but are not aligned parallel relative to the widths of the gate electrodes 14 (i.e., relative to direction D1). Instead, the lengths of the wires 56, 58 in wiring level 40 are aligned non-parallel relative to the widths of the gate electrodes 14. In the representative embodiment, the lengths of the wires 56, 58 in wiring level 40 are aligned transverse or perpendicular to the widths of the gate electrodes 14 extending in direction D1. In the wiring layout, the difference in the alignment routes the wires 56, 58 in orthogonal or transverse paths crossing over and across the gate electrodes 14.

The via level 42 and the wiring level 44 are formed in one of more dielectric layers 60. Via level 42 includes multiple contacts 62 that extending through the one or more dielectric layers 60 to the wires 56 and multiple contacts 64 extending through the one or more dielectric layers 60 to the wires 58. Wiring level 40 includes wires 66 coupled by the contacts 62 with the wires 56 and wires 68 coupled by the contacts 64 with the wires 58. Wiring level 40 is located between wiring level 44 and the device structures 16, 18, 20, the wires 66 are stacked with the wires 56, and the wires 68 are stacked with the wires 58. The wires 66, 68 have a thickness or height relative to the plane of the substrate 10, as well as lengths and widths in a plane normal to the height. The lengths of the wires 66, 68 are significantly larger than their respective widths, and are aligned in the direction D2.

The wires 66, 68 in wiring level 44 are aligned in the direction D2 parallel to each other and with the wires 56, 58 in wiring level 40, but are not aligned parallel relative to the widths of the gate electrodes 14 (i.e., relative to direction D1). Instead, the lengths of the wires 66, 68 in wiring level 44 are aligned non-parallel relative to the widths of the gate electrodes 14 extending in direction D1. In the representative embodiment, the lengths of the wires 66, 68 in wiring level 44 are aligned transverse or perpendicular to the widths of the gate electrodes 14. In the wiring layout, the difference in the alignment routes the wires 66, 68 in orthogonal or transverse paths crossing over and across the gate electrodes 14.

The via level 46 and the wiring level 48 are formed in one or more dielectric layers 70. Via level 46 includes multiple contacts 72 extending through the one or more dielectric layers 70 to the wires 66 and multiple contacts 74 extending through the one or more dielectric layers 70 to the wires 68. Wiring level 48 includes wires 76 coupled by the contacts 72 with the wires 66 and wires 78 coupled by the contacts 74 with the wires 68. Wiring level 44 is located between wiring level 48 and wiring level 40. The wires 76, 78 in wiring level 48 are aligned parallel to each other and relative to the gate electrodes 14. In particular, the wires 76, 78 have a thickness or height relative to the plane of the substrate 10, as well as lengths and widths in a plane normal to the height. The lengths, which are significantly larger than the respective widths, of the wires 76, 78 are aligned in the direction D1 that is parallel with the widths of the gate electrodes 14 extending in direction D1 and are aligned perpendicular relative to the lengths of wires 56, 58 and the lengths of wires 66, 68, each of which extending in direction D2.

In an embodiment, the wires 76, 78 may be included in a topmost wiring level of the interconnect structure 36 that is externally for establishing external connections with the chip circuitry on the substrate 10. Wire 76 may comprise a port that couples the switch 12 with an antenna 80, such as an antenna for a mobile electronics product. Wire 78 may comprise another port that couples the switch 12 with an amplifier 82, such as a low-noise amplifier or a power amplifier formed as circuitry on the substrate 10.

The levels 38, 40, 42, 44, 46, 48 of the interconnect structure 36 may be formed, for example, by deposition, polishing, lithography, and etching techniques characteristic of a damascene process. In a representative embodiment, for each of the levels 38, 40, 42, 44, 46, 48, one or more dielectric layers may be deposited and a pattern of via openings and/or trenches may be defined therein using lithography and etching. In particular, the alignment of the trenches used to form the wires in the wiring levels 40, 44, 48 may be selected in the features of the photomask, which is used to form the resist mask during lithography. The resulting via openings and/or trenches may be lined with a liner (e.g., a bilayer of tantalum and tantalum nitride) and filled with conductor to define contacts and wires. In the latter regard, a thick layer of a conductor may be deposited that overfills the vias and/or trenches. The conductor layer is planarized, such as with chemical mechanical polishing (CMP), to remove the conductor from the one or more dielectric layers so that conductive features remain embedded.

The contacts 52, 54 may be comprised of a conductor, such as tungsten (W). Wires 58, 58, 66, 68, 76, 78 and contacts 62, 64, 72, 74 may be comprised of a conductor such as copper (Cu), aluminum (Al), a copper-aluminum alloy (AlCu), or another metal, and may be clad by a refractory metal, such as tantalum (Ta), tantalum nitride (TaN), titanium (Ti), and/or titanium nitride (TiN). These types of metals may be deposited by chemical vapor deposition (CVD), physical vapor deposition (PVD), or an electrochemical process like electroplating or electroless plating. The dielectric layers 50, 60, 70 may be comprised of an electrically-insulating dielectric material, such as borophosphosilicate glass (BPSG), phosphosilicate glass (PSG), silicon nitride, hydrogenated silicon oxycarbide (SiCOH), or silicon dioxide, and may be may be deposited by chemical vapor deposition.

In use, the gate electrodes 14 of the switch 12 may be powered to turn on the device structures 16, 18, 20 of the switch 12. To that end, the switch 12 receives an electrical input at the gate electrodes 14 of the constituent device structures 16, 18, 20 to turn "on" or "off". For example, a positive voltage applied as the electrical input to the gate electrodes 14 may turn device structures 16, 18, 20 of the switch 12 on and a negative voltage applied as the electrical input to the gate electrodes 14 may turn the device structures 16, 18, 20 of the switch 12 off. Current (e.g., a signal from an antenna amplified by a low noise amplifier or a signal from a power amplifier in transit to the antenna) may be received at the switch 12 through wires 76. The current will flow through wires 66 and contacts 72, 62 to wires 56, and from wires 56 through the contacts 52 to the source/drain regions 28 and silicide layer 34 thereon, then through the channel regions 32 beneath the gate electrodes 14 to the source/drain regions 30 and silicide layer 34 thereon, and then to the contacts 54 to wires 58. The current flows through contacts 64, 74 and wires 68 to wires 78 and, after traveling through all of the serially-coupled device structures 16, 18, 20, exits the switch 12.

The chip structure including the device structures 16, 18, 20 of the switch 12 and the interconnect structure 36 provides certain technical improvements. Aligning the wires 56, 58 in a direction different than the direction of the gate electrodes 14 increases the spacing in the wiring layout between adjacent pairs of wires 56, 58. Similarly, aligning the wires 66, 68 in a direction different than the direction of the gate electrodes 14 increases the spacing in the wiring layout between adjacent wires 66, 68. The increased spacing of the wires 56, 58 and the increased spacing of the wires 66, 68 in the wiring layout of the interconnect structure 36 may be effective to reduce the contribution of the wiring capacitance to the total electrical capacitance in comparison with conventional designs featuring wires in the different wiring levels that are all parallel and have a higher level of proximity to each other. The increased spacing of the wires 56, 58 and the increased spacing of the wires 66, 68 in the wiring layout of the interconnect structure 36 may also promote an ability to increase in the widths of the wires 56, 58 and wires 66, 68 in the wiring layout, which may be effective to reduce the electrical resistance.

In accordance with embodiments of the invention, at least one of the wiring levels 40, 44, 48 is not oriented or arranged in a direction that is parallel to the direction of the gate electrodes 14. Instead, at least one of the wiring levels 40, 44, 48 is aligned in a direction that is non-parallel (e.g., transverse or perpendicular) to the direction of the gate electrodes 14. In alternative embodiments, the wiring levels 40, 44, 48 can be arranged in the wiring layout such that a different combination of the wiring levels 40, 44, 48 is not arranged parallel to the gate electrodes 14. In an embodiment, the wires 56, 58 in the lower wiring level 40 closest to the plane of the device structures 16, 18, 20 may always be non-parallel relative to direction D1 regardless of the alignment of wires 66, 68, 76, 78 in the upper wiring levels 44, 48 that are more distant from the plane of the device structures 16, 18, 20.

Figure 2:
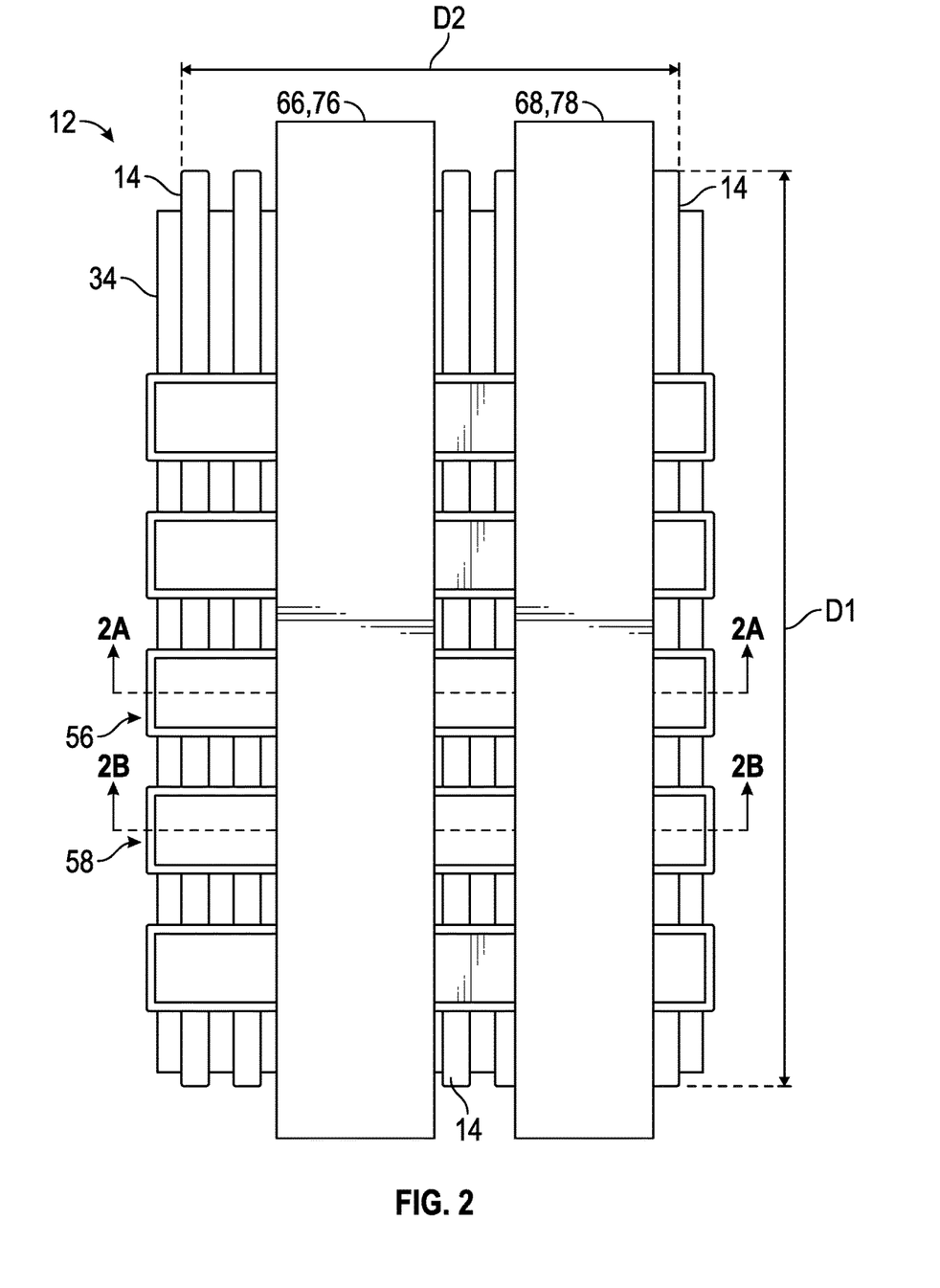
FIG. 2 is a top view of a chip structure in accordance with an alternative embodiment of the invention and in which the dielectric layers of the interconnect structure are omitted for clarity of description.
Figure 2A:
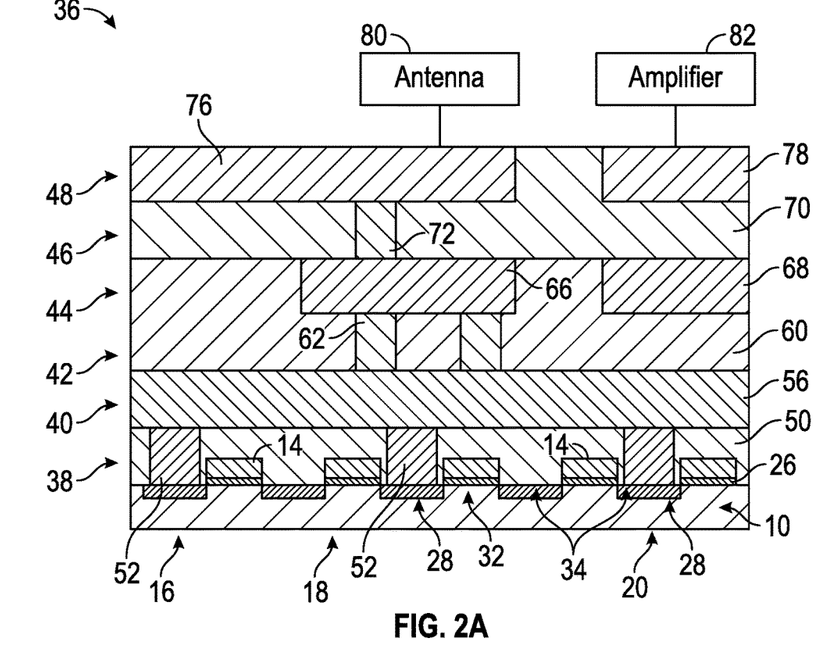
FIG. 2A is a cross-sectional view taken generally along line 2A-2A in FIG. 2.
Figure 2B:
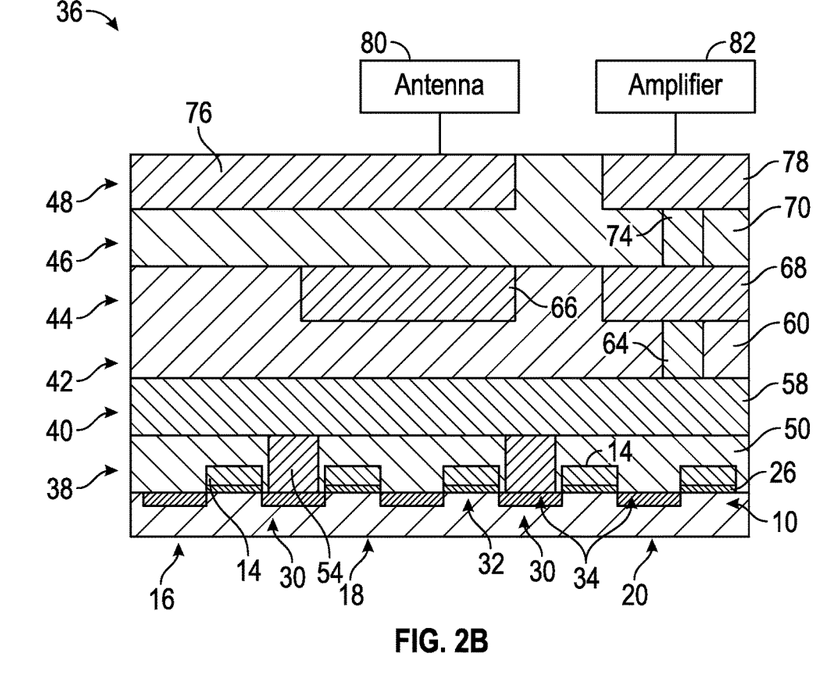
FIG. 2B is a cross-sectional view taken generally along line 2B-2B in FIG. 2.

With reference to FIGS. 2, 2A, 2B in which like reference numerals refer to like features in FIGS. 1, 1A, 1B and in accordance with an alternative embodiment, the arrangement of the wiring levels 40, 44, 48 in the wiring layout may be modified such that the lengths of the wires 56, 58 of wiring level 40 are aligned in direction D2 and are not aligned parallel to the direction D1 in which the widths of the gate electrodes 14 are aligned. In this embodiment, the lengths of the wires 66, 68 in wiring level 44 and the lengths of the wires 76, 78 in wiring level 48 are aligned parallel relative to the widths of the gate electrodes 14. As a result, the wires 56, 58 are not stacked with either wires 66, 68 or with wires 76, 78. The positions of the contacts in levels 38, 42, 46 may be adjusted to accommodate the rearrangement of the wiring levels 40, 44, 48. In the wiring layout, the difference in the alignment routes the wires 56, 58 in wiring level 40 in orthogonal or transverse paths crossing over and across the gate electrodes 14.

Figure 3:
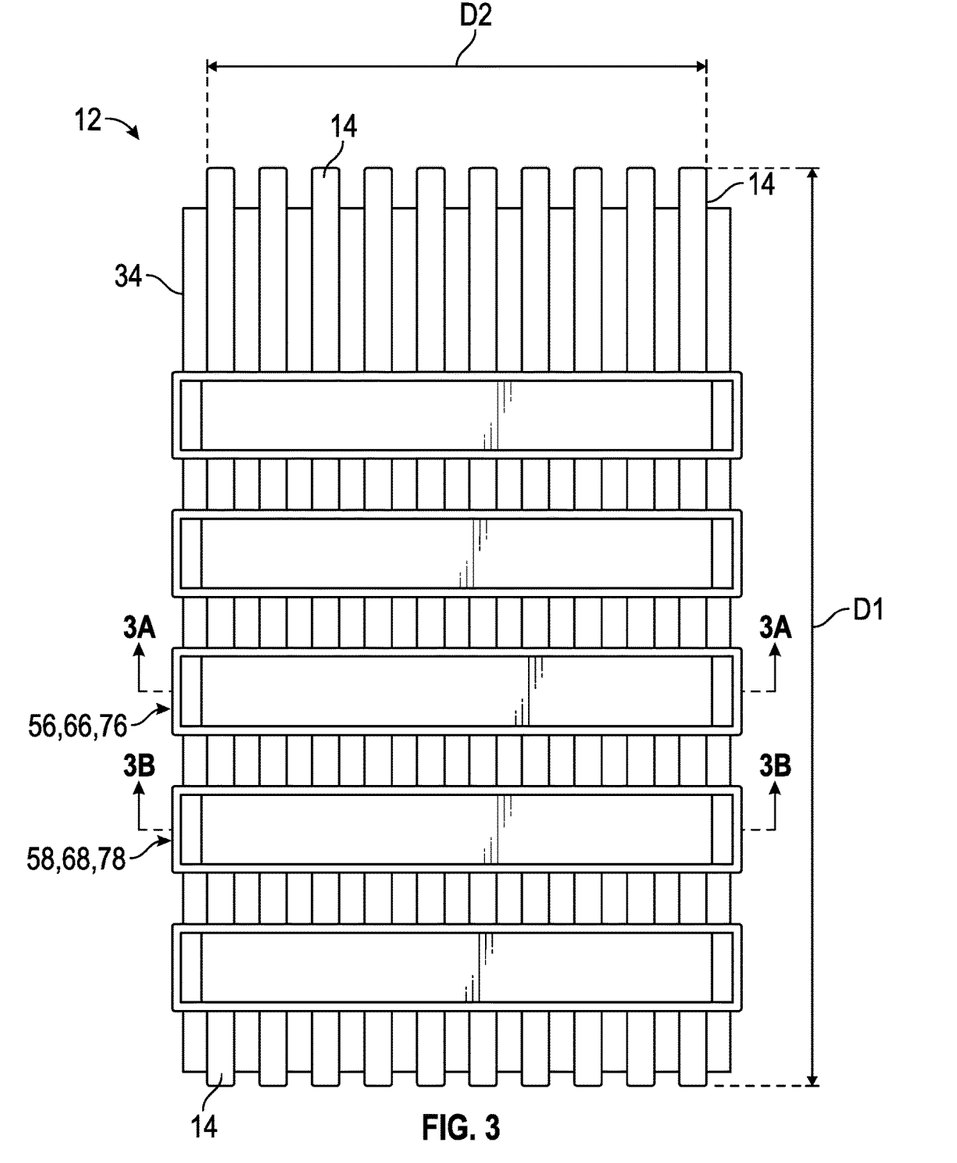
FIG. 3 is a top view of a chip structure in accordance with an alternative embodiment of the invention and in which the dielectric layers of the interconnect structure are omitted for clarity of description.
Figure 3A:
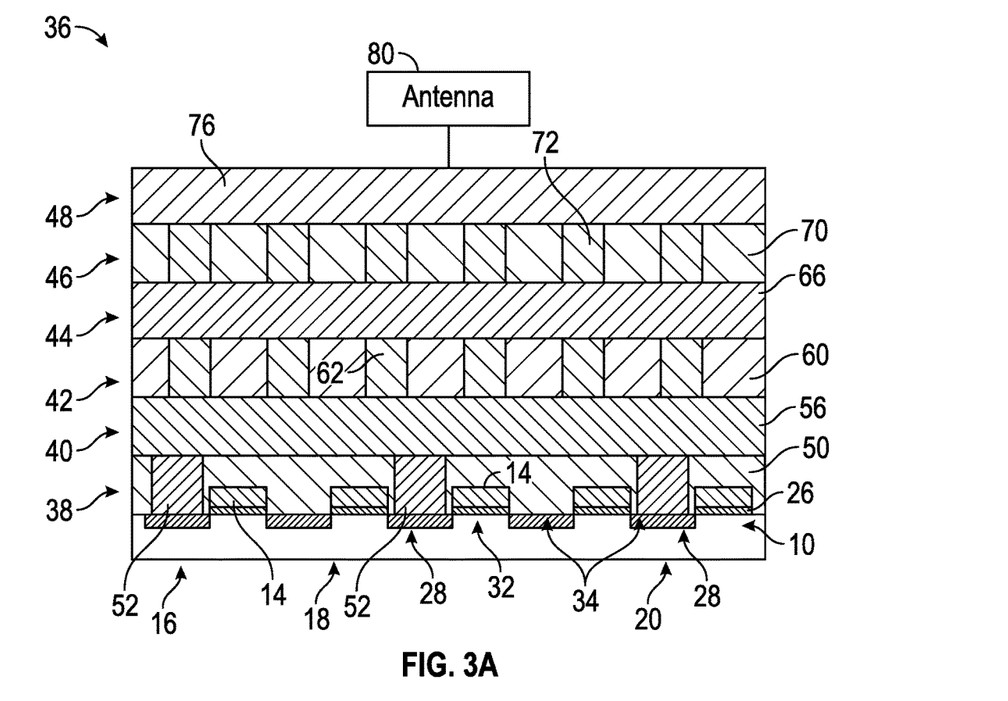
FIG. 3A is a cross-sectional view taken generally along line 3A-3A in FIG. 3.
Figure 3B:
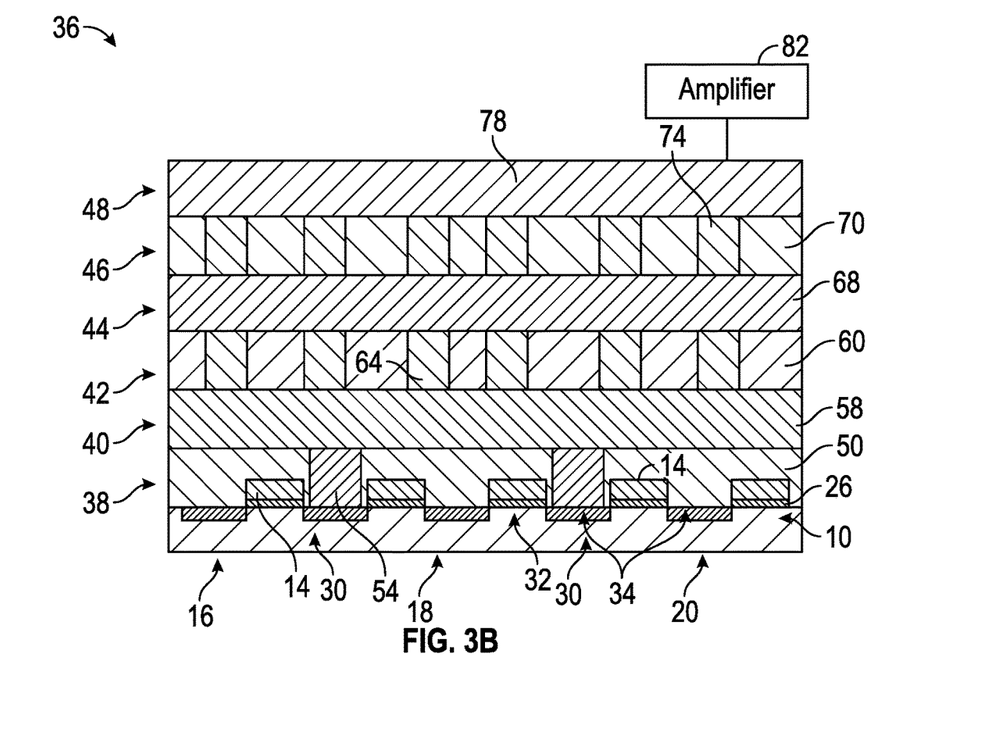
FIG. 3B is a cross-sectional view taken generally along line 3B-3B in FIG. 3.

With reference to FIGS. 3, 3A, 3B in which like reference numerals refer to like features in FIGS. 2, 2A, 2B and in accordance with an alternative embodiment, the arrangement of the wiring levels 40, 44, 48 in the wiring layout may be modified such that the respective lengths of the wires 56, 58 of wiring level 40, the wires 66, 68 in wiring level 44, and the wires 76, 78 in wiring level 48 are all aligned in direction D2. Accordingly, the wires 56, 58, 66, 68, 76, 78 in the different levels 40, 44, 48 are not aligned parallel relative to the widths of the gate electrodes 14 extending in direction D1. The positions of the contacts in levels 38, 42, 46 may be adjusted to accommodate the rearrangement of the wiring levels 40, 44, 48. In the wiring layout, the difference in the alignment routes the wires 56, 58 in wiring level 40, the wires 66, 68 in wiring level 44, and the wires 76, 78 in wiring level 48 in orthogonal or transverse paths crossing over and across the gate electrodes 14.

In design schematics, the "on" state of the switch 12 may be represented as a resistor and the "off" state of the switch 12 may be represented as a capacitor. The on-resistance (Ron) of the switch 12 includes a contribution from the wiring of the interconnect structure. A reduction in Ron allows more of the signal to travel from one port to the other port when the switch 12 is on. The off-capacitance (Coff) of the field effect transistors may be associated with isolation between the ports of the switch 12. A reduction in Coff will stop more of the signal from traveling from one port to another when the switch 12 is off, and will enhance isolation. Coff includes a contribution from interconnect capacitances. The modification to the alignment of the wiring in at least one of the wiring levels 40, 44, 48, in accordance with the embodiments of the invention, permits the values for Ron and Coff of the switch 12 to be engineered and manipulated to improve a figure of merit (FOM), such as the product of Ron and Coff (i.e., Ron*Coff), used to rate the performance of an RF switch.

Figure 4:
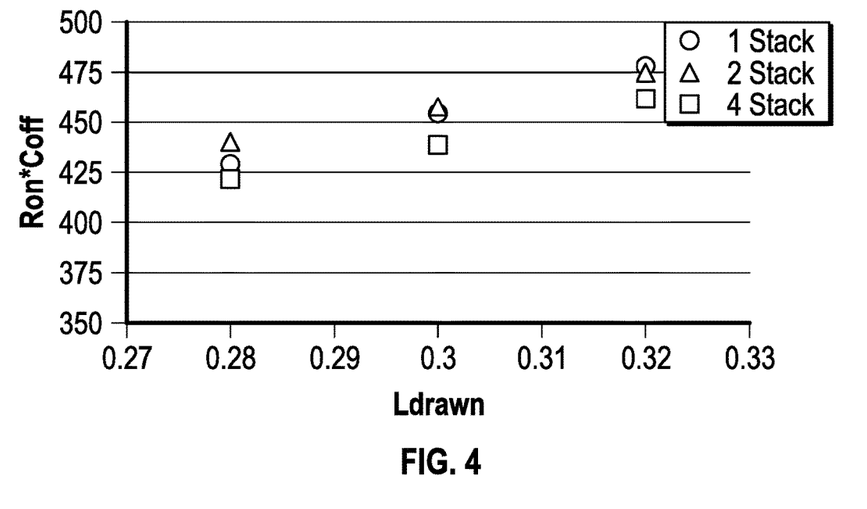
FIG. 4 is a graph plotting the product of off-capacitance and on-resistance for chip structures fabricated in accordance with the embodiment of the invention shown in FIGS. 1, 1A, 1B.

With reference to FIG. 4, a graph plotting the product of Off-Capacitance and On-Resistance is shown for switches of different device geometries coupled with a wiring layout in accordance with the embodiment of the invention shown in FIGS. 1, 1A, 1B. The switches included one or more transistors each with 29 gate electrode fingers that are 36 µm in width and a series of different widths resulting in gate lengths of 0.32 µm, 0.30 µm, and 0.28 µm. For each set of gate electrode parameters and stacks, an interconnect structure was formed that was coupled with 1, 2, and 4 stacks, where the number of stacks indicates a number of transistors coupled in series. The off-capacitance and on-resistance were extracted from S-parameter measurements made using a network analyzer. The frequency of operation during the measurement of Ron and Coff was 1 GHz.

Figure 5:
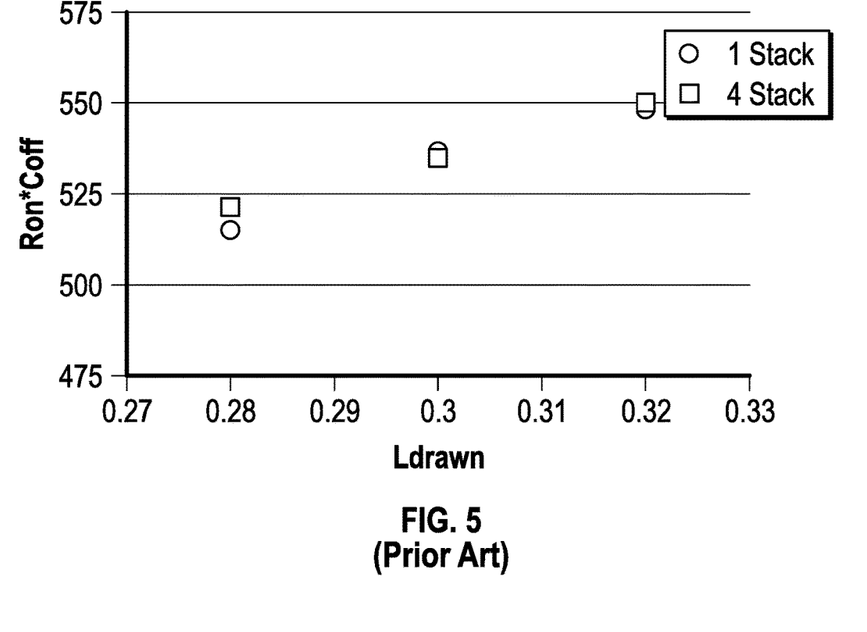
FIG. 5 is a graph plotting the product of off-capacitance and on-resistance for chip structures fabricated in accordance with the prior art in which all wiring is directionally aligned parallel with the gate electrodes.

Generally, the value of Ron*Coff is observed to decrease in FIG. 4 with decreasing gate length. The values of Ron*Coff shown in FIG. 4 can be compared with the values of Ron*Coff shown in FIG. 5 for device structures with the same device geometry and in which the wires in the interconnect structure are all directionally aligned parallel with the gate electrode fingers. For all values of the gate length and number of stacks, the value of Ron*Coff for a device structure fabricated in accordance with the embodiment of the invention (FIG. 4) is less than the value of Ron*Coff for the prior at device structure (FIG. 5). The improvement in Ron*Coff originates primarily from a reduced contribution of the wires in the non-parallel wiring levels in the wiring layout to the total capacitance, which was observed to be largely independent of device geometry.

Figure 6:
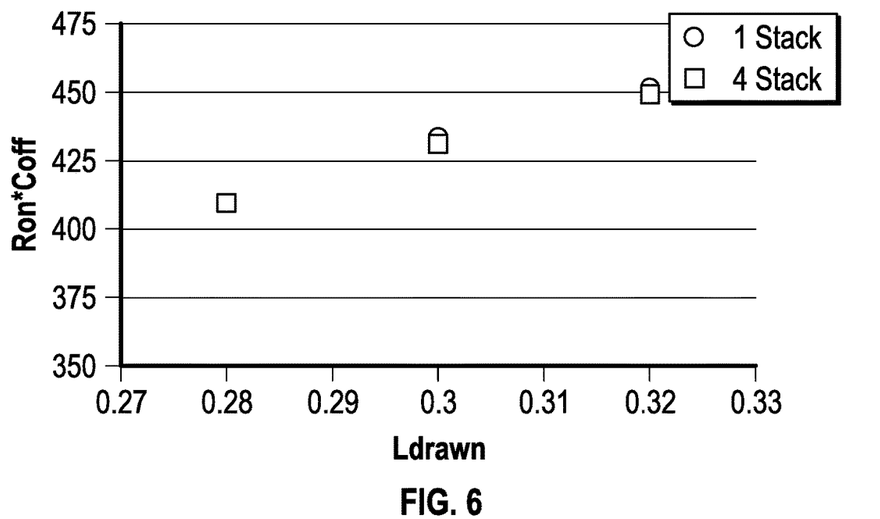
FIG. 6 is a graph plotting the product of off-capacitance and on-resistance for chip structures fabricated in accordance with the embodiment of the invention shown in FIGS. 2, 2A, 2B.

With reference to FIG. 6, a graph plotting the product of Off-Capacitance and On-Resistance is shown for switches of different device geometries coupled with a wiring layout in accordance with the embodiment of the invention shown in FIGS. 2, 2A, 2B. The switches included one or more transistors each with 29 gate electrode fingers that are 36 µm in width and a series of different widths resulting in gate lengths of 0.32 µm, 0.30 µm, and 0.28 µm. For each set of gate electrode parameters and stacks, an interconnect structure was formed that was coupled with 1, 2, and 4 stacks, where the number of stacks indicates a number of transistors coupled in series. The off-capacitance and on-resistance were extracted from S-parameter measurements made using a network analyzer. The frequency of operation during the measurement of Ron and Coff was 1 GHz.

Generally, the value of Ron*Coff is observed to decrease in FIG. 6 with decreasing gate length. The values of Ron*Coff shown in FIG. 6 can be compared with the values of Ron*Coff shown in FIG. 5 for the prior art device structure. For all values of the gate length and number of stacks, the value of Ron*Coff for the device structure fabricated in accordance with the embodiment of the invention (FIG. 6) is less than the value of Ron*Coff for the prior art device structure (FIG. 5). The improvement in Ron*Coff originates primarily from a reduced contribution of the wires in the non-parallel wiring levels in the wiring layout to the total capacitance, which was observed to be largely independent of device geometry.

Figure 7:
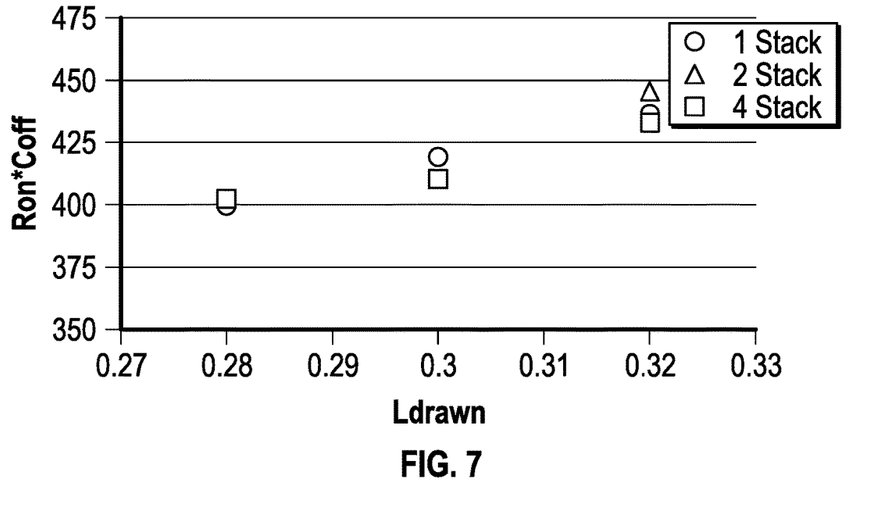
FIG. 7 is a graph plotting the product of off-capacitance and on-resistance for chip structures fabricated in accordance with the embodiment of the invention shown in FIGS. 3, 3A, 3B.

With reference to FIG. 7, a graph plotting the product of Off-Capacitance and On-Resistance is shown for switches of different device geometries coupled with a wiring layout in accordance with the embodiment of the invention shown in FIGS. 3, 3A, 3B. The switches included one or more transistors each with 29 gate electrode fingers that are 36 µm in width and a series of different widths resulting in gate lengths of 0.32 µm, 0.30 µm, and 0.28 µm. For each set of gate electrode parameters and stacks, an interconnect structure was formed that was coupled with 1, 2, and 4 stacks, where the number of stacks indicates a number of transistors coupled in series. The off-capacitance and on-resistance were extracted from S-parameter measurements made using a network analyzer. The frequency of operation during the measurement of Ron and Coff was 1 GHz.

Generally, the value of Ron*Coff is observed to decrease in FIG. 7 with decreasing gate length. The values of Ron*Coff shown in FIG. 7 can be compared with the values of Ron*Coff shown in FIG. 5 for the prior art device structure. For all values of the gate length and number of stacks, the value of Ron*Coff for the device structure fabricated in accordance with the embodiment of the invention (FIG. 7) is less than the value of Ron*Coff for the prior art device structure (FIG. 5). The improvement in Ron*Coff originates primarily from a reduced contribution of the wires in the non-parallel wiring levels in the wiring layout to the total capacitance, which was observed to be largely independent of device geometry.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a dimension within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A chip structure comprising:
a first transistor including a first source/drain region, a second source/drain region, and a gate electrode, the gate electrode having a long axis aligned in a first direction and a short axis aligned in a second direction that is perpendicular to the first direction;
a second transistor including a first source/drain region, a second source/drain region, and a gate electrode, the gate electrode having a long axis aligned in the first direction and a short axis aligned in the second direction;
a first contact level including a first contact directly and physically connected with the first source/drain region of the first transistor and a second contact directly and physically connected with the first source/drain region of the second transistor; and
a first wiring level including a first wire directly and physically connected with the first contact and directly and physically connected with the second contact, the first wire having a width and a length aligned in the second direction such that the first wire crosses over the long axis of the gate electrode of the first transistor and the long axis of the gate electrode of the second transistor.

2. The chip structure of claim 1 wherein the first wiring level includes a second wire coupled with the second source/drain region, the second wire has a length aligned in the second direction, and the second wire has a spaced relationship with the first wire.

3. The chip structure of claim 1 further comprising:
a second wiring level including a second wire coupled with the first wire, the second wire having a length aligned in the second direction.

4. The chip structure of claim 3 further comprising:
a third wiring level including a third wire coupled with the second wire, the third wire having a length aligned in the first direction, the third wiring level separated from the first source/drain region by the first wiring level and the second wiring level.

5. The chip structure of claim 3 further comprising:
a third wiring level including a third wire coupled with the second wire, the third wire having a length aligned in the second direction, and the third wiring level separated from the first source/drain region by the first wiring level and the second wiring level.

6. The chip structure of claim 1 further comprising:
a second wiring level including a second wire coupled with the first wire, the second wire having a length aligned in the first direction.

7. The chip structure of claim 6 further comprising:
a third wiring level including a third wire coupled with the second wire, the third wire having a length aligned in the first direction, and the third wiring level separated from the first source/drain region by the first wiring level and the second wiring level.

8. The chip structure of claim 1 further comprising:
an antenna; and
an amplifier coupled by the transistor and the first wiring level with the antenna.

9. A method of fabricating a chip structure, the method comprising:
forming a transistor including a first source/drain region, a second source/drain region, and a gate electrode having a long axis aligned in a first direction and a short axis aligned in a second direction that is perpendicular to the first direction;
forming a second transistor including a first source/drain region, a second source/drain region, and a gate electrode, the gate electrode having a long axis aligned in the first direction and a short axis aligned in the second direction;
forming a first contact level including a first contact directly and physically connected with the first source/drain region of the first transistor and a second contact directly and physically connected with the first source/drain region of the second transistor; and
forming a first wiring level including a first wire directly and physically connected with the first contact and directly and physically connected with the second contact
wherein the first wire has a width and a length aligned in the second direction such that the first wire crosses over the long axis of the gate electrode of the first transistor and the long axis of the gate electrode of the second transistor.

10. The method of claim 9 wherein the first wiring level includes a second wire coupled with the second source/drain region, the second wire has a length aligned in the second direction, and the second wire has a spaced relationship with the first wire.

11. The method of claim 9 further comprising:
forming a second wiring level including a second wire coupled with the first wire,
wherein the second wire has a length aligned in the second direction.

12. The method of claim 11 further comprising:
forming a third wiring level including a third wire coupled with the second wire,
wherein the third wire has a length aligned in the first direction, and the third wiring level is separated from the first source/drain region by the first wiring level and the second wiring level.

13. The method of claim 11 further comprising:
forming a third wiring level including a third wire coupled with the second wire,
wherein the third wire has a length aligned in the second direction, and the third wiring level is separated from the first source/drain region by the first wiring level and the second wiring level.

14. The method of claim 9 further comprising:
forming a second wiring level including a second wire coupled with the first wire,
wherein the second wire has a length aligned in the first direction.

15. The method of claim 14 further comprising:
forming a third wiring level including a third wire coupled with the second wire,
wherein the third wire has a length aligned in the first direction, and the third wiring level is separated from the first source/drain region by the first wiring level and the second wiring level.

16. The method of claim 9 wherein the transistor and the first wiring level couple an amplifier and an antenna.

* * * * *